United States Patent
Ko et al.

(10) Patent No.: US 6,245,666 B1
(45) Date of Patent: Jun. 12, 2001

(54) METHOD FOR FORMING A DELAMINATION RESISTANT MULTI-LAYER DIELECTRIC LAYER FOR PASSIVATING A CONDUCTOR LAYER

(75) Inventors: May-Ho Ko; Shing-Long Lee, both of Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/541,483

(22) Filed: Apr. 3, 2000

(51) Int. Cl.[7] .................................................. H01L 21/302
(52) U.S. Cl. .......................... 438/623; 438/688; 438/720; 438/624
(58) Field of Search ..................................... 438/623, 624, 438/720, 688, FOR 354

(56) References Cited

U.S. PATENT DOCUMENTS

| | | | |
|---|---|---|---|
| 4,474,642 | * 10/1984 | Nakame et al. . | |
| 4,592,800 | * 6/1986 | Landau et al. . | |
| 4,927,514 | * 5/1990 | Solomon et al. . | |
| 5,006,377 | * 4/1991 | Delcorps et al. . | |
| 5,126,008 | * 6/1992 | Levy . | |
| 5,185,058 | 2/1993 | Cathey, Jr. | 156/656 |
| 5,399,527 | 3/1995 | Tabara | 437/194 |
| 5,500,279 | * 3/1996 | Walter et al. . | |
| 5,519,254 | 5/1996 | Tabara | 257/751 |
| 5,639,345 | 6/1997 | Huang et al. | 156/657.1 |
| 5,670,421 | 9/1997 | Nishitani et al. | 437/192 |
| 5,702,980 | 12/1997 | Yu et al. | 437/187 |
| 5,858,869 | * 1/1999 | Chen et al. . | |
| 5,882,489 | 3/1999 | Bersin et al. | 204/192.35 |
| 6,090,717 | * 7/2000 | Powell et al. . | |
| 6,103,630 | * 8/2000 | Lee et al. . | |

OTHER PUBLICATIONS

Stanley Wolf, Silicon Processing for the VLSI Era, Lattice Press, vol. 2, pp. 209–210, and 233–235, May 1997.*

* cited by examiner

Primary Examiner—George Fourson
Assistant Examiner—Joannie Adelle Garcia
(74) Attorney, Agent, or Firm—George O. Saile; Stephen B. Ackerma; Stephen G. Stanton (57) ABSTRACT

Within a method for forming a microelectronic fabrication, there is first provided a substrate. There is then formed over the substrate a blanket aluminum containing conductor layer. There is then formed over the blanket aluminum containing conductor layer a masking layer. There is then etched, while employing a plasma etch method, the blanket aluminum containing conductor layer to form a patterned aluminum containing conductor layer while employing the masking layer as an etch mask layer, where the plasma etch method employs an etchant gas composition comprising at least one fluorine containing etchant gas and at least one halogen containing etchant gas other than a fluorine containing etchant gas. There is then formed contacting the patterned aluminum containing conductor layer a conformal dielectric liner layer. There is then formed upon the conformal dielectric liner layer a spin-on-glass (SOG) planarizing layer. Finally, there is then thermally annealed the spin-on-glass (SOG) planarizing layer to form a thermally cured spin-on-glass (SOG) planarizing layer. By employing the at least one fluorine containing etchant gas in conjunction with the at least one halogen containing etchant gas other than the fluorine containing etchant gas within the etchant gas composition for forming from the blanket aluminum containing conductor layer the patterned aluminum containing conductor layer, there is attenuated a delamination of the thermally cured spin-on-glass (SOG) planarizing layer from the conformal dielectric liner layer.

16 Claims, 3 Drawing Sheets

METHOD FOR FORMING A DELAMINATION RESISTANT MULTI-LAYER DIELECTRIC LAYER FOR PASSIVATING A CONDUCTOR LAYER

BACKGROUND OF THE INVENTION

1. Field of the Invention

The present invention relates generally to dielectric layers employed within microelectronic fabrications. More particularly, the present invention relates to delamination resistant multi-layer dielectric layers for passivating patterned conductor layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly significant within the art of microelectronic fabrication to form microelectronic fabrications with enhanced levels of stability and reliability, since incident to forming microelectronic fabrications with decreased dimensions there is often enhanced internal stresses within a microelectronic fabrication such that the microelectronic fabrication is formed with diminished stability and reliability.

It is thus towards the goal of forming within the art of microelectronic fabrication microelectronic fabrications with enhanced stability and reliability that the present invention is directed.

Various methods have been disclosed in the art of microelectronic fabrication for forming, in general, microelectronic fabrications, or more particularly, various microelectronic layers within microelectronic fabrications, with enhanced or desirable properties.

For example, Cathey et al., in U.S. Pat. No. 5,185,058, discloses a method for forming a patterned metal containing conductor layer within a microelectronic fabrication, where the patterned metal containing conductor layer is formed with a vertical sidewall profile or a positively tapered sidewall profile, rather than a negatively tapered sidewall profile or an otherwise undercut sidewall profile. The method realizes the foregoing object by employing when forming the patterned metal containing conductor layer from a corresponding blanket metal containing conductor layer while employing a plasma etch method an etchant gas composition which includes in addition to an etchant gas a coating gas, where the coating gas comprises a gaseous oxide of carbon, such as carbon monoxide or carbon dioxide, along with a silicon containing compound, such as silicon tetrafluoride, silicon tetrachloride or silicon tetrabromide.

In addition, Tabara, in U.S. Pat. No. 5,399,527 and U.S. Pat. No. 5,519,254, discloses a multi-layer aluminum containing conductor layer structure fabricated within a microelectronic fabrication, and a method for forming the multi-layer aluminum containing conductor layer structure fabricated within the microelectronic fabrication, where a capping layer within the multi-layer aluminum containing conductor layer structure fabricated within the microelectronic fabrication is less susceptible to thinning incident to etching, while employing a plasma etch method, a via through a silicon containing dielectric layer which passivates the multilayer aluminum containing conductor layer when etching the via to reach the multi-layer aluminum containing conductor layer. The method realizes the foregoing object by incorporating into the capping layer, which is not otherwise formed of an aluminum containing conductor material, a conductor material, such as aluminum, which suppresses etching of the capping layer within the plasma etch method.

Further, Huang et al., in U.S. Pat. No. 5,639,345, discloses a method for forming, with improved cross-substrate thickness uniformity, a reactive ion etch (RIE) etchback planarized spin-on-glass (SOG) planarizing layer within a microelectronic fabrication. The method realizes the foregoing object by employing when forming the reactive ion etch (RE) etchback planarized spin-on-glass (SOG) planarizing layer within the microelectronic fabrication, in sequence: (1) a first reactive ion etch (RIE) method having a lower etch rate for a portion of a spin-on-glass (SOG) planarizing layer formed over the center of a substrate employed within the microelectronic fabrication with respect to the periphery of the substrate employed within the microelectronic fabrication, followed by; (2) a second reactive ion etch (RE) method having a higher etch rate for the portion of the spin-on-glass (SOG) planarizing layer formed over the center of the substrate employed within the microelectronic fabrication with respect to the periphery of the substrate employed within the microelectronic fabrication.

Still further, Nishitani et al., in U.S. Pat. No. 5,670,421, discloses a method for selectively forming within a via through a dielectric layer within a microelectronic fabrication, which via accesses a conductor layer within the microelectronic fabrication, a chemical vapor deposited (CVD) tungsten layer with high selectivity even when the surface of the conductor layer exposed within the via has been subject to a pre-cleaning to assure optimal contact with the chemical vapor deposited (CVD) tungsten layer. The method realizes the foregoing object by employing, either concurrent with or subsequent to pre-cleaning of the surface of the conductor layer, a stabilizing treatment for the surface of the dielectric layer which is otherwise activated incident to pre-cleaning of the surface of the conductor layer exposed within the via.

Yet still further, Yu et al., in U.S. Pat. No. 5,702,980, discloses a method for forming within a microelectronic fabrication a spin-on-glass (SOG) sandwich composite planarizing dielectric layer construction within attenuated defect formation within an upper lying capping dielectric layer within the spin-on-glass (SOG) sandwich composite planarizing dielectric layer construction. The method employs when forming the spin-on-glass (SOG) sandwich composite planarizing dielectric layer construction a bilayer upper lying capping dielectric layer comprising: (1) a first upper lying capping dielectric layer formed contacting at least in part portions of a spin-on-glass (SOG) layer planarizing layer, where the first upper lying capping dielectric layer is formed of a first silicon oxide dielectric material deposited employing a plasma enhanced chemical vapor deposition (PECVD) method employing silane as a silicon source materials and oxygen as an oxidant source material; and (2) a second upper lying capping dielectric layer formed upon the first upper lying capping dielectric layer, where the second upper lying capping dielectric layer is formed of a second silicon oxide dielectric material deposited employing a plasma enhanced chemical vapor deposition (PECVD) method employing tetraethylorthosilicate as a silicon source material.

Finally, Bersin et al., in U.S. Pat. No. 5,882,489, discloses a method for stripping from over a substrate employed within a microelectronic fabrication organic residues and inorganic residues, such as obtained from photoresist materials, without use of acids or organic solvents when stripping the organic residues and inorganic residues. To realize the foregoing object, the method first employs an oxygen plasma ashing to strip organic residues, followed by, in either order: (1) a rinsing within deionized water to remove any remaining soluble organic residues; and (2) a sputtering within an argon ion sputtering method to remove inorganic residues.

Desirable in the art of microelectronic fabrication are additional methods and materials which may be employed to form microelectronic fabrications with enhanced stability and reliability.

It is towards the foregoing object that the present invention is directed.

SUMMARY OF THE INVENTION

A first object of the present invention is to provide a method for forming a microelectronic fabrication.

A second object of the present invention is to provide a method in accord with the first object of the present invention, where the microelectronic fabrication is formed with enhanced stability and reliability.

A third object of the present invention is to provide a method in accord with the first object of the present invention and the second object of the present invention, which method is readily commercially implemented.

In accord with the objects of the present invention, there is provided by the present invention a method for forming a microelectronic fabrication. To practice the method of the present invention, there is first provided a substrate. There is then formed over the substrate a blanket aluminum containing conductor layer. There is then formed over the blanket aluminum containing conductor layer a mask layer. There is then etched, while employing a plasma etch method, the blanket aluminum containing conductor layer to form a patterned aluminum containing conductor layer while employing the mask layer as an etch mask layer, where the plasma etch method employs an etchant gas composition comprising a fluorine containing etchant gas and a halogen containing etchant gas other than a fluorine containing etchant gas. There is then formed contacting the patterned aluminum containing conductor layer a conformal dielectric finer layer. There is then formed upon the conformal dielectric liner layer an uncured spin-on-glass (SOG) planarizing layer. Finally, there is then thermally annealed the uncured spin-on-glass (SOG) planarizing layer to form a thermally cured spin-on-glass (SOG) planarizing layer.

By employing within the present invention within the etchant gas composition for plasma etching the blanket aluminum containing conductor to form the patterned aluminum containing conductor layer a fluorine containing etchant gas in addition to a halogen containing etchant gas other than the fluorine containing etchant gas, there is attenuated a delamination of the thermally cured spin-on-glass (SOG) planarizing layer from the conformal dielectric liner layer upon thermally curing the uncured spin-on-glass (SOG) planarizing layer to form the thermally cured spin-on-glass (SOG) planarizing layer.

The present invention provides a method for forming a microelectronic fabrication, where the microelectronic fabrication is formed with enhanced stability and reliability. The present invention realizes the foregoing object by employing when forming a patterned aluminum containing conductor layer from a blanket aluminum containing conductor layer within a microelectronic fabrication while employing a plasma etch method an etchant gas composition comprising a fluorine containing etchant gas and a halogen containing etchant gas other than a fluorine containing etchant gas. By employing within the present invention within the etchant gas composition for plasma etching the blanket aluminum containing conductor to form the patterned aluminum containing conductor layer the fluorine containing etchant gas in conjunction with the halogen containing etchant gas other than the fluorine containing etchant gas, there is attenuated a delamination of a thermally cured spin-on-glass (SOG) planarizing layer from a conformal dielectric liner layer upon thermally curing an uncured spin-on-glass (SOG) planarizing layer to form the thermally cured spin-on-glass (SOG) planarizing layer, where the conformal dielectric liner layer is formed upon the patterned aluminum containing conductor layer and the thermally cured spin-on-glass (SOG) planarizing layer is formed upon the conformal dielectric liner layer.

The method of the present invention is readily commercially implemented. The present invention employs methods and materials as are generally known in the art of microelectronic fabrication. Since it is a specific materials selection and process control which provides at least in part the present invention, rather than the existence of methods and materials which provides the present invention, the method of the present invention is readily commercially implemented.

BRIEF DESCRIPTION OF THE DRAWINGS

The objects, features and advantages of the invention are understood within the context of the Description of the Preferred Embodiment, which follows. The Description of the Preferred Embodiment is understood within the context of the accompanying drawings, which form a material part of this disclosure, wherein.

DESCRIPTION OF THE PREFERRED EMBODIMENT

The present invention provides a method for forming a microelectronic fabrication, where the microelectronic fabrication is formed with enhanced stability and reliability. The present invention realizes the foregoing object by employing when forming a patterned aluminum containing conductor layer from a blanket aluminum containing conductor layer within the microelectronic fabrication while employing a plasma etch method an etchant gas composition comprising a fluorine containing etchant gas and a halogen containing etchant gas other than a fluorine containing etchant gas. By employing within the present invention within the etchant gas composition for plasma etching the blanket aluminum containing conductor to form the patterned aluminum containing conductor layer the fluorine containing etchant gas in conjunction with the halogen containing etchant gas other than the fluorine containing etchant gas, there is attenuated delamination of a thermally cured spin-on-glass (SOG) planarizing layer from a conformal dielectric liner layer upon thermally curing an uncured spin-on-glass (SOG) planarizing layer to form the thermally cured spin-on-glass (SOG) planarizing layer, where the conformal dielectric liner layer is formed upon the patterned aluminum containing conductor layer and the thermally cured spin-on-glass (SOG) planarizing layer is formed upon the conformal dielectric liner layer.

The present invention may be employed for forming with enhanced stability and reliability within microelectronic fabrications patterned aluminum containing conductor layers passivated by conformal dielectric liner layers in turn having formed thereupon thermally cured spin-on-glass (SOG) planarizing layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, while the preferred embodiment of the present invention illustrates the present invention within the context of attenuating delamination of a thermally cured blanket spin-on-glass (SOG) planarizing layer from a blanket conformal dielectric liner layer in turn formed upon a pair of patterned aluminum containing conductor layers, the present invention need not necessarily be limited to patterned aluminum containing conductor layers and may thus also be employed for attenuating delamination of a thermally cured spin-on-glass (SOG) planarizing layer from a conformal dielectric liner layer in turn formed upon an aluminum containing conductor layer which is not patterned.

Figure 1:
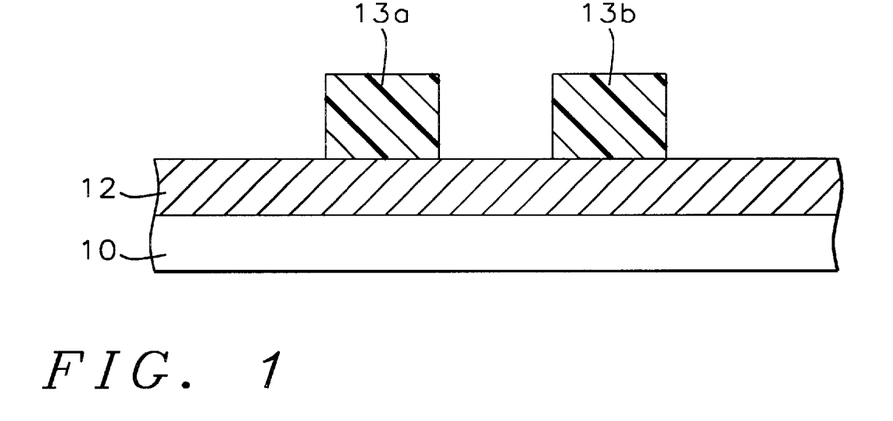
FIG. 1, FIG. 2, FIG. 3, FIG. 4, FIG. 5 and FIG. 6 show a series of schematic crosssectional diagrams illustrating the results of forming, in accord with a preferred embodiment of the present invention, a microelectronic fabrication in accord with the present invention.

Referring now to FIG. 1 to FIG. 6, there is shown a series of schematic cross-sectional diagrams illustrating the results of forming, in accord with a preferred embodiment of the present invention, a microelectronic fabrication in accord with the present invention, with enhanced stability and reliability. Shown in FIG. 1 is a schematic cross-sectional diagram of the microelectronic fabrication at an early stage in its fabrication in accord with the present invention.

Shown in FIG. 1 is a substrate 10 having formed thereupon a blanket aluminum containing conductor layer 12, which in turn has formed thereupon a pair of patterned photoresist layers 13a and 13b.

Within the preferred embodiment of the present invention within the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may be a substrate alone as employed within the microelectronic fabrication, or in the alternative, the substrate 10 may be the substrate as employed within the microelectronic fabrication, where the substrate has formed thereupon and/or thereover any of several additional layers as are conventional within the microelectronic fabrication within which is employed the substrate. Similarly with the substrate, such additional microelectronic layers may be formed from microelectronic materials including but not limited to microelectronic conductor materials, microelectronic semiconductor materials and microelectronic dielectric materials.

Within the preferred embodiment of the present invention, typically and preferably, but not exclusively, at least a portion of the substrate 10 which contacts the blanket aluminum containing conductor layer 12 is formed of a microelectronic dielectric material.

Similarly, although also not specifically illustrated within the schematic crosssectional diagram of FIG. 1, the substrate 10, typically and preferably, but not exclusively, when the substrate 10 comprises a semiconductor substrate employed within a semiconductor integrated circuit microelectronic fabrication, has formed therein and/or thereupon, and thus incorporated therein, microelectronic devices as are conventional within the microelectronic fabrication which employs the substrate 10. Such microelectronic devices may include, but are not limited to, resistors, transistors, diodes and capacitors.

Within the preferred embodiment of the present invention with respect to the blanket aluminum containing conductor layer 12, the blanket aluminum containing conductor layer 12 may be formed of an aluminum containing conductor material selected from the group including but not limited to aluminum and aluminum alloys, preferably of aluminum content greater than about 90 weight percent (such aluminum alloys including but not limited to aluminum-copper alloys, aluminum-silicon alloys and aluminum-copper-silicon alloys). Similarly the blanket aluminum containing conductor layer 12 may have formed laminated beneath and/or above, and thus incorporated therein, an upper barrier layer and/or a lower barrier layer formed of a barrier material as is conventional in the art of microelectronic fabrication, such barrier materials being selected from the group of barrier materials including but not limited to titanium barrier materials, titanium-tungsten barrier materials, titanium nitride barrier materials and tungsten nitride barrier materials. Typically and preferably, the aluminum containing conductor layer 12 is formed to a thickness of from about 4000 to about 6000 angstroms, with any barrier layer(s) laminated thereto and incorporated therein forming a minor thickness thereof, typically and preferably less than about 30 percent of the thickness thereof, more preferably from about 15 to about 25 percent of the thickness thereof Finally, within the preferred embodiment of the present invention with respect to the pair of patterned photoresist layers 13a and 13b, the pair of patterned photoresist layers 13a and 13b may be formed from any of several types of photoresist materials as are conventional in the art of microelectronic fabrication, including but not limited to photoresist materials selected from the general groups of photoresist materials including but not limited to positive photoresist materials and negative photoresist materials. Typically and preferably, each patterned photoresist layer 13a or 13b within the pair of patterned photoresist layers 13a and 13b is formed to a thickness of from about 15000 to about 20000 angstroms, a linewidth of from about 0.4 to about 0.5 microns and a pitch dimension of from about 0.8 to about 1.0 microns.

As is understood by a person skilled in the art, although the preferred embodiment of the present invention illustrates a pair of patterned photoresist layers 13a and 13b which will subsequently be employed as a pair of mask layers within the present invention, there may alternatively be employed within the present invention mask layers formed of mask materials other than photoresist materials. Such alternative mask layers may be formed of mask materials including but not limited to conductor hard mask materials, semiconductor hard mask materials and dielectric hard mask materials.

Figure 2:
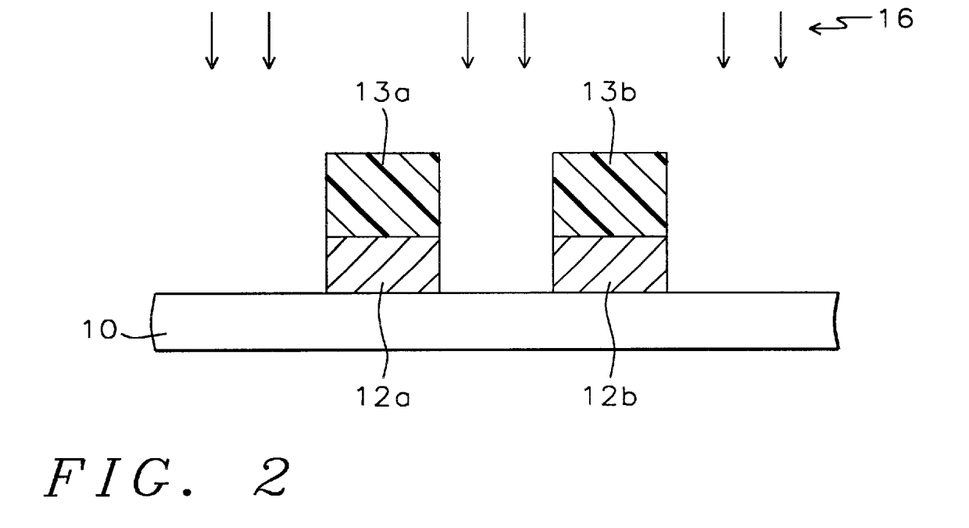

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic crosssectional diagram is illustrated in FIG. 1, but wherein the blanket aluminum containing conductor layer 12 has been patterned to form a pair of patterned aluminum containing conductor layers 12a and 12b, while employing an etching plasma 16, in conjunction with the pair of patterned photoresist layers 13a and 13b as a pair of patterned photoresist etch mask layers.

Within the preferred embodiment of the present invention, the etching plasma 16 employs an etchant gas composition comprising at least one fluorine containing etchant gas and at least one halogen containing etchant gas other than a fluorine containing etchant gas. Within the preferred embodiment of the present invention with respect to the fluorine containing etchant gas(es), the fluorine containing etchant gas(es) may be selected from the group of fluorine containing etchant gases including but not limited to perfluorocarbons of up to about 5 carbon atoms, hydrofluorocarbons of up to about 5 carbon atoms, hydrogen fluoride, sulfur hexafluoride and nitrogen trifluoride. Within the preferred embodiment of the present invention, the halogen containing etchant gas(es) other than the fluorine containing etchant gas may be selected from the group consisting of chlorine, hydrogen chloride, boron trichloride, bromine, hydrogen bromide and boron tribromide. More typically and preferably, the etchant gas composition employed within the etching plasma 16 comprises trifluoromethane, chlorine and boron trichloride, along with: (1) optional non-reactive diluent and stabilizer gases which provide for a stabilized etching plasma 16; as well as (2) optional sputtering gases. Yet more preferably, the etchant gas composition consists essentially of trifluoromethane, chlorine and boron trichloride, along with: (1) optional non-reactive diluent and stabilizer gases, which provide for a stabilized etching plasma 16; as well as (2) a sputtering gas, such as but not limited to an argon sputtering gas.

When etching the blanket aluminum containing conductor layer 12 to form the patterned aluminum containing conductor layers 12a and 12b over an eight inch diameter substrate 10, the plasma etch method which employs the etching plasma 16 also employs: (1) a reactor chamber pressure of from about 6 to about 12 mtorr; (2) a source radio frequency power of from about 800 to about 1200 watts at a source radio frequency of 13.56 MHZ, and a bias power of from about 100 to about 200 watts; (3) a substrate 10 temperature of from about 80 to about 100 degrees centigrade; (4) a trifluoromethane flow rate of about 5 to about 20 standard cubic centimeters per minute (sccm); (5) a chlorine flow rate of from about 40 to about 80 standard cubic centimeters per minute (sccm); (6) a boron trichloride flow rate of from about 50 to about 70 standard cubic centimeters per minute (sccm); and (7) an argon flow rate of from about 30 to about 50 standard cubic centimeters per minute (sccm).

Figure 3:
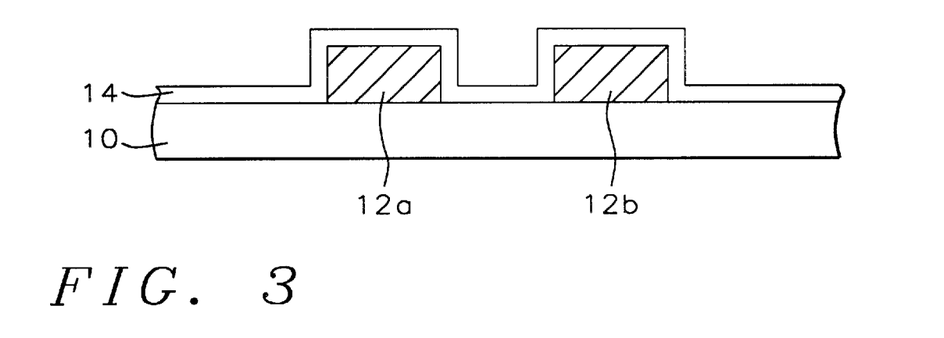

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, there is stripped from the microelectronic fabrication the pair of patterned photoresist layers 13a and 13b. The pair of patterned photoresist layers 13a and 13b may be stripped from the microelectronic fabrication whose schematic cross-sectional diagram is illustrated in FIG. 2 to provide in part the microelectronic fabrication whose schematic cross-sectional diagram is illustrated in FIG. 3 while employing photoresist stripping methods as are conventional in the art of microelectronic fabrication, such photoresist stripping methods including but not limited to wet chemical photoresist stripping methods and dry plasma photoresist stripping methods. Similarly, as is understood by a person skilled in the art, under circumstances where there is employed a pair of hard mask layers in place of the pair of patterned photoresist layers 13a and 13b there may alternatively optionally be avoided stripping the pair of hard mask layers when forming in part the microelectronic fabrication whose schematic cross-sectional diagram is illustrated in Pig. 3 from the microelectronic fabrication whose schematic cross-sectional diagram is illustrated in FIG. 2.

Also shown, in a second instance, within the schematic cross-sectional diagram of FIG. 3 is a blanket conformal dielectric liner layer 14 formed upon the pair of patterned aluminum containing conductor layers 12a and 12b and portions of the substrate 10 exposed adjacent the pair of patterned aluminum containing conductor layers 12a and 12b.

Within the preferred embodiment of the present invention the blanket conformal dielectric liner layer 14 may be formed employing methods and materials as are conventional in the art of microelectronic fabrication, including but not limited to low pressure chemical vapor deposition (LPCVD) methods and plasma enhanced chemical vapor deposition (PECVD) methods, to form the blanket conformal dielectric liner layer 14 of a dielectric material selected from the group including but not limited to silicon oxide dielectric materials, silicon nitride dielectric materials and silicon oxynitride dielectric materials. For reasons as are discussed and illustrated below, the present invention provides particular value when the blanket conformal dielectric liner layer 14 is formed of a silicon oxide dielectric material deposited employing a plasma enhanced chemical vapor deposition (PECVD) method and more particularly a silicon oxide dielectric material deposited employing a plasma enhanced chemical vapor deposition (PECVD) method employing silane as a silicon source material, although other methods and materials may be employed when forming the blanket conformal dielectric liner layer 14.

When forming the blanket conformal dielectric liner layer 14 of the silicon oxide dielectric material deposited while employing the plasma enhanced chemical vapor deposition (PECVD) method upon the pair of patterned aluminum containing conductor layers 12a and 12b and portions of the substrate 10 exposed adjoining the pair of patterned aluminum containing conductor layers 12a and 12b, upon an eight inch diameter substrate 10, the plasma enhanced chemical vapor deposition (PECVD) method typically and preferably employs parameters and limits as are conventional in the art. Typically and preferably, the blanket conformal dielectric liner layer 14 is formed to a thickness of from about 200 to about 500 angstroms.

Figure 4:
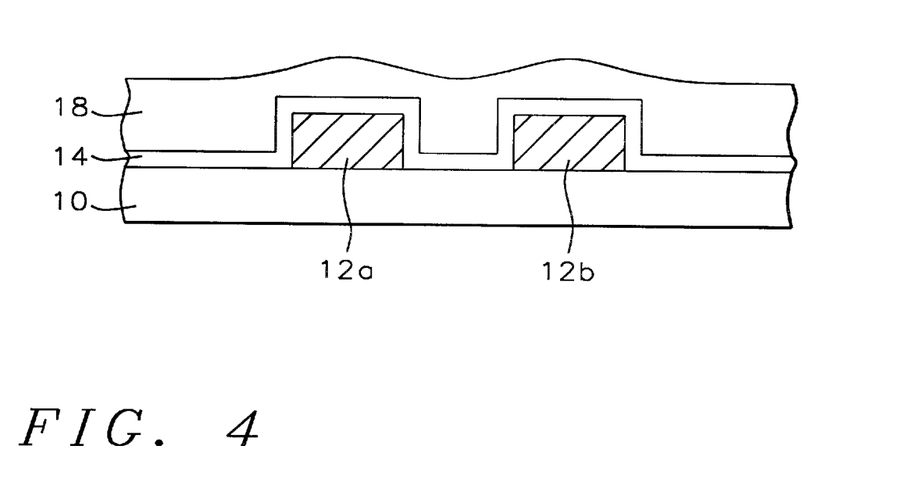

Referring not to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein there is formed upon the blanket conformal dielectric liner layer 14 a blanket uncured spin-on-glass (SOG) planarizing layer 18.

Within the present invention and the preferred embodiment of the present invention, the blanket uncured spin-on-glass (SOG) planarizing layer 18 is formed of a spin-on-glass (SOG) planarizing material as is conventional in the art of microelectronic fabrication, such a spin-on-glass (SOG) planarizing material being selected from the group including but not limited to silicate (orthosilicic acid) spin-on-glass (SOG) planarizing materials and siloxane (silsesquioxane) spin-on-glass (SOG) planarizing materials (such as but not limited to hydrogen silsesquioxane spin-on-glass (SOG) planarizing materials, carbon bonded hydrocarbon silsesquioxane spin-on-glass (SOG) planarizing materials (such as but not limited to methyl silsesquioxane spin-on-glass (SOG) planarizing materials and ethyl silsesquioxane spin-on-glass (SOG) planarizing materials) and carbon bonded fluorocarbon silsesquioxane spin-on-glass (SOG) planarizing materials (such as but not limited to perfluoromethyl silsesquioxane spin-on-glass (SOG) planarizing materials and perfluoroethyl silsesquioxane spin-on-glass (SOG) planarizing materials)). Preferably, the spin-on-glass (SOG) planarizing material formed to a thickness of from about 12000 to about 15000 angstroms after soft baking at conventional conditions of temperature and time to remove any remaining carrier solvent within the blanket uncured spin-on-glass (SOG) planarizing layer 18.

Figure 5:
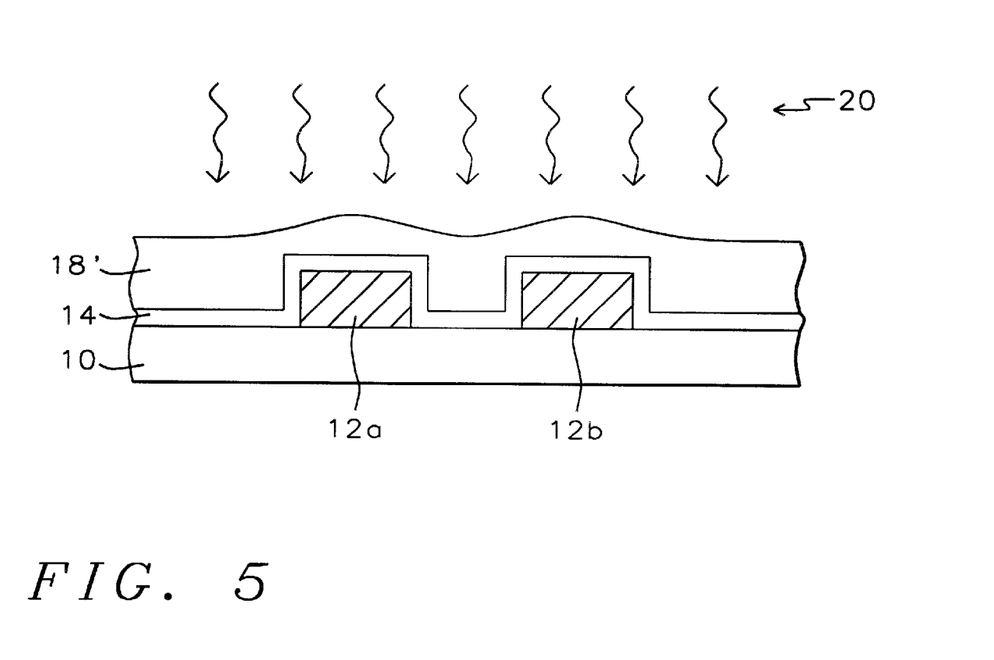

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein the blanket uncured spin-on-glass (SOG) planarizing layer 18 has been thermally annealed within a thermally annealing environment 20 to form therefrom a thermally cured blanket spin-on-glass (SOG) planarizing layer 18'.

Within the preferred embodiment of the present invention, the blanket uncured spin-on-glass (SOG) planarizing layer 18 is typically and preferably thermally annealed within the thermal annealing environment 20 while employing conventional conditions of temperature and time, when forming therefrom the thermally cured blanket spin-on-glass (SOG) planarizing layer 18'. As is illustrated within the schematic cross-sectional diagram of FIG. 5, there is no delamination of any of the layers within the microelectronic fabrication whose schematic cross-sectional diagram is illustrated in FIG. 5, when forming the microelectronic fabrication whose schematic cross-sectional diagram is illustrated in FIG. 5 from the microelectronic fabrication whose schematic cross-sectional diagram is illustrated in FIG. 4 while employing the thermal annealing method which employs the thermal annealing environment 20, and thus the microelectronic fabrication whose schematic cross-sectional diagram is illustrated in FIG. 5 is formed with enhanced stability (in particular thermal stability with respect to delamination) and thus also enhanced reliability.

Figure 6:
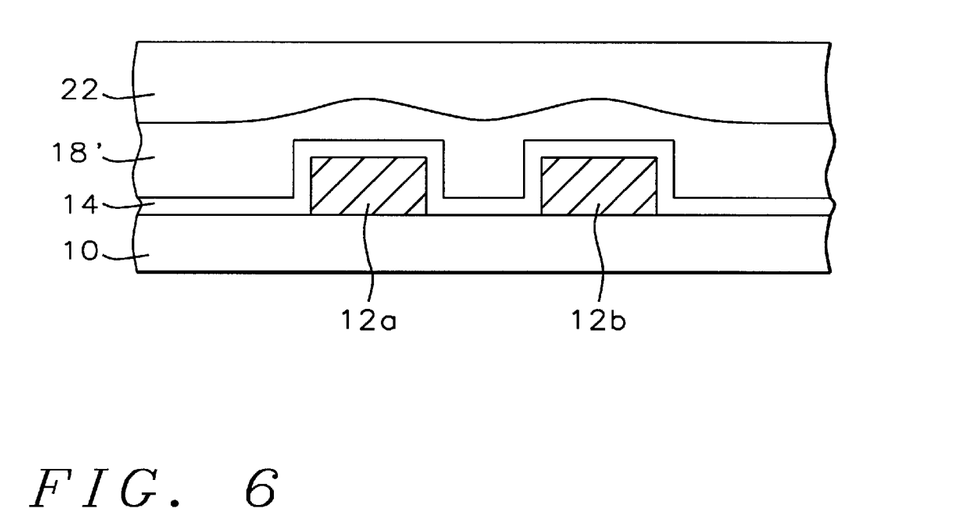

Referring now to FIG. 6, there is shown a schematic cross-sectional diagram illustrating the results of further processing of the microelectronic fabrication whose schematic cross-sectional diagram is illustrated in FIG. 5. Shown in FIG. 6 is a schematic cross-sectional diagram of a microelectronic fabrication otherwise equivalent to the microelectronic fabrication whose schematic cross-sectional diagram is illustrated in FIG. 5, but wherein there is formed upon the thermally cured blanket spin-on-glass (SOG) planarizing layer 18' a planarized blanket conformal capping layer 22.

Within the present invention and the preferred embodiment of the present invention, the planarized blanket conformal capping layer 22 may be formed employing methods and materials as are conventional in the art of microelectronic fabrication, such methods and materials being analogous or equivalent to the methods employed for forming the blanket conformal dielectric liner layer 14, with the exception that the planarized blanket conformal capping layer 22 is initially formed of a substantially greater thickness and subsequently planarized to form the planarized blanket conformal capping layer 22. Within the preferred embodiment of the present the planarized blanket conformal capping layer 22 is preferably formed of a silicon oxide dielectric material deposited employing a plasma enhanced chemical vapor deposition PECVD) method employing either silane or tetraethylorthosilicate as a silicon source material, and planarized employing a chemical mechanical polish (CMP) planarizing method.

Figure 7:
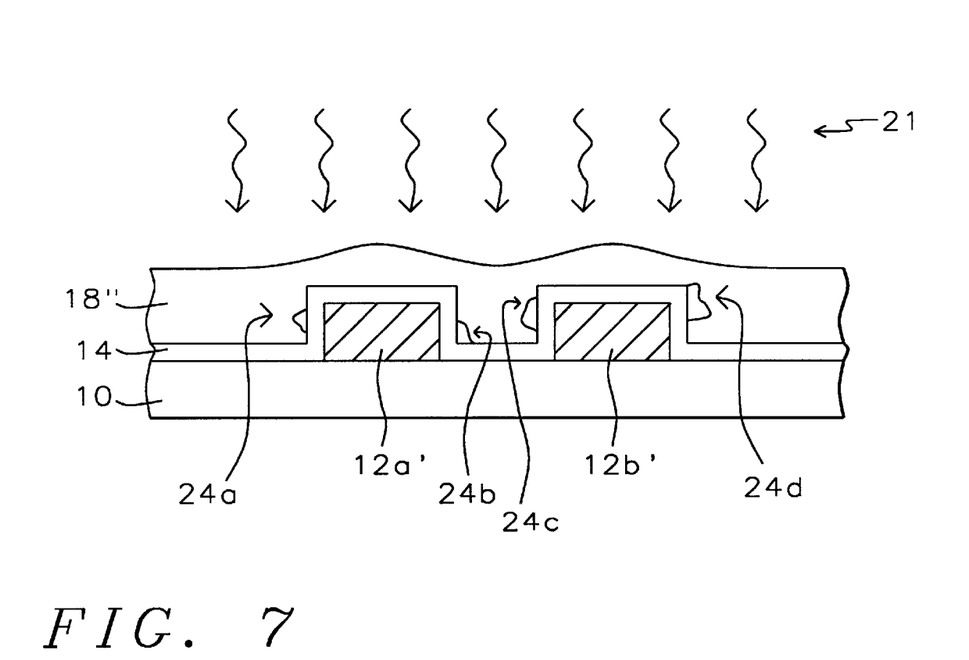
FIG. 7 shows a schematic cross-sectional diagram of a microelectronic fabrication otherwise equivalent to the microelectronic fabrication whose schematic cross-sectional diagram is illustrated in FIG. 5, but not formed in accord with the present invention.

Referring now to FIG. 7, there is shown a schematic cross-sectional diagram illustrating a microelectronic fabrication fabricated not in accord with the present invention.

Shown in FIG. 7 is a schematic cross-sectional diagram of a microelectronic fabrication otherwise generally equivalent to the microelectronic fabrication whose schematic cross-sectional diagram is illustrated in FIG. 6, but wherein in a first instance the patterned aluminum containing conductor layers 12a and 12b have instead been replaced with the patterned aluminum containing conductor layers 12a' and 12b'. Within FIG. 7, it is intended that the patterned aluminum containing conductor layers 12a' and 12b' are formed while employing a plasma etch method otherwise analogous or equivalent to the plasma etch method employing the etching plasma 16 as employed for forming the patterned aluminum containing conductor layers 12a and 12b as illustrated within the schematic cross-sectional diagram of FIG. 2, but wherein a plasma employed therein, analogous the etching plasma 16, does not include therein a fluorine containing etchant gas but rather employs only a halogen containing etchant gas other than the fluorine containing etchant gas.

As is similarly also illustrated within the schematic cross-sectional diagram of FIG. 7, a thermally cured blanket spin-on-glass (SOG) planarizing layer 18" otherwise generally equivalent to the thermally cured blanket spin-on-glass (SOG) planarizing layer 18' as illustrated within the preferred embodiment of the present invention within FIG. 5 incident to its formation within a thermal annealing environment 21 equivalent to the thermal annealing environment 20 as illustrated within the schematic cross-sectional diagram of FIG. 5 delaminates at various portions of the interface of the blanket conformal liner layer 14 with the thermally cured blanket spin-on-glass (SOG) planarizing layer 18" to thus form a series of voids 24a, 24b, 24c and 24d.

Thus, as is illustrated within the schematic cross-sectional diagram of FIG. 7, there is formed when not employing the method of the present invention a microelectronic fabrication, where the microelectronic fabrication is formed with reduced stability (in particular thermally induced delamination stability) and thus reduced reliability.

For exemplary purposes, semiconductor substrates were fabricated in accord with either: (1) FIG. 1 to FIG. 6; or (2) FIG. 7, and they were cross-sectioned and analyzed while employing a scanning electron microscopy method for voids within the bilayer dielectric structure which comprised the blanket conformal dielectric liner layer having formed thereupon the thermally cured blanket spin-on-glass (SOG) planarizing layer. Within a first semiconductor substrate fabricated in accord with FIG. 7 there was observed voids at the interface of the blanket conformal dielectric liner layer and the thermally cured blanket spin-on-glass (SOG) planarizing layer, thus indicating delamination at that interface and attendant stability and reliability concerns. Within a second semiconductor substrate fabricated in accord with FIG. 1 to FIG. 6 there was not observed any voids at the interface of the blanket conformal dielectric liner layer and the thermally cured blanket spin-on-glass (SOG) planarizing layer, thus indicating enhanced stability and reliability of that microelectronic fabrication.

While not wishing to necessarily be bound to any particular theory of operation of the present invention, it is believed that by employing when forming a patterned aluminum containing conductor layer while employing a plasma etch method employing an etching plasma which employs an etchant gas composition comprising a fluorine containing etchant gas and a halogen containing etchant gas other than the fluorine containing etchant gas that there is formed upon the sidewalls of the patterned aluminum containing conductor layer fluorine containing compounds which provide for a somewhat less adherent base upon which may be formed a blanket conformal dielectric liner layer. Thus, incident to providing a somewhat less adherent a interface between the patterned aluminum containing conductor layer and the blanket conformal dielectric liner layer, there is presumably provided a less physically stressed interface between a thermally cured blanket spin-on-glass (SOG) planarizing layer formed upon the blanket conformal dielectric liner layer with an attendant reduced susceptibility for delamination and void formation at the interface of the blanket conformal dielectric liner layer and the thermally cured blanket spin-on-glass (SOG) planarizing layer.

As is understood by a person skilled in the art, the preferred embodiment and examples of the present invention are illustrative of the present invention rather than limiting of the present invention. Revisions and modifications may be made to methods, materials, structures and dimensions through which is provided a microelectronic fabrication in accord with the preferred embodiment and examples of the present invention while still providing a microelectronic fabrication in accord with the present invention, in accord with the appended claims.

What is claimed is:

1. A method for forming a microelectronic fabrication comprising:

providing a substrate;

forming an aluminum containing conductor layer over the substrate;

etching, while employing a plasma etch method, the aluminum containing conductor layer to form an etched aluminum containing conductor layer, the plasma etch method employing an etchant gas composition comprising at least one fluorine containing etchant gas and at least one halogen containing etchant gas other than a fluorine containing etchant gas;

forming a conformal dielectric liner layer contacting the etched aluminum containing conductor layer;

forming an uncured spin-on-glass (SOG) planarizing layer upon the conformal dielectric liner layer; and thermally annealing the uncured spin-on-glass (SOG) planarizing layer to form a thermally cured spin-on-glass (SOG) planarizing layer, whereby by employing the plasma etch method, there is attenuated a delamination of the thermally cured spin-on-glass (SOG) planarizing layer from the conformal dielectric liner layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the aluminum containing conductor layer is formed of an aluminum containing conductor material selected from the group consisting of aluminum, aluminum alloys, laminates containing aluminum and laminates containing aluminum alloys.

4. The method of claim 1 wherein:

the at least one fluorine containing etchant gas is selected from the group consisting of perfluorocarbons of up to about 5 carbon atoms, hydrofluorocarbons of up to about 5 carbon atoms, hydrogen fluoride, nitrogen trifluoride and sulfur hexafluoride; and the at least one halogen containing etchant gas other than the fluorine containing etchant gas is selected from the group consisting of chlorine, hydrogen chloride, boron trichloride, bromine, hydrogen bromide and boron tribromide.

5. The method of claim 1 wherein the conformal dielectric liner layer is formed of a silicon oxide dielectric material formed employing a plasma enhanced chemical vapor deposition (PECVD) method.

6. The method of claim 5 wherein the plasma enhanced chemical vapor deposition (PECVD) method employs silane as a silicon source material.

7. The method of claim 1 wherein the spin-on-glass (SOG) planarizing layer is formed from a spin-on-glass (SOG) planarizing material selected from the group consisting of silicate spin-on-glass (SOG) planarizing materials and siloxane spin-on-glass (SOG) planarizing materials.

8. A method for forming a microelectronic fabrication comprising:

providing a substrate;

forming a blanket aluminum containing conductor layer over the substrate;

forming a masking layer over the blanket aluminum containing conductor layer;

etching, while employing a plasma etch method, the blanket aluminum containing conductor layer to form a patterned aluminum containing conductor layer while employing the masking layer as an etch mask layer, the plasma etch method employing an etchant gas composition comprising at least one fluorine containing etchant gas and at least one halogen containing etchant gas other than a fluorine containing etchant gas;

forming a conformal dielectric liner layer contacting the patterned aluminum containing conductor layer;

forming an uncured spin-on-glass (SOG) planarizing layer upon the conformal dielectric liner layer; and thermally annealing the uncured spin-on-glass (SOG) planarizing layer to form a thermally cured spin-onglass (SOG) planarizing layer, whereby by employing the plasma etch method, there is attenuated a delamination of the thermally cured spin-on-glass (SOG) planarizing layer from the conformal dielectric liner layer.

9. The method of claim 8 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

10. The method of claim 8 wherein the blanket aluminum containing conductor layer is formed of an aluminum containing conductor material selected from the group consisting of aluminum, aluminum alloys, laminates containing aluminum and laminates containing aluminum alloys.

11. The method of claim 8 wherein:

the at least one fluorine containing etchant gas is selected from the group consisting of perfluorocarbons of up to about 5 carbon atoms, hydrofluorocarbons of up to about 5 carbon atoms, hydrogen fluoride, nitrogen trifluoride and sulfur hexafluoride; and the at least one halogen containing etchant gas other than the fluorine containing etchant gas is selected from the group consisting of chlorine, hydrogen chloride, boron trichloride, bromine, hydrogen bromide and boron tribromide.

12. The method of claim 8 wherein the blanket conformal dielectric liner layer is formed of a silicon oxide dielectric material formed employing a plasma enhanced chemical vapor deposition (PECVD) method.

13. The method of claim 12 wherein the plasma enhanced chemical vapor deposition (PECVD) method employs silane as a silicon source material.

14. The method of claim 8 wherein the spin-on-glass (SOG) planarizing layer is formed from a spin-on-glass (SOG) planarizing material selected from the group consisting of silicate spin-on-glass (SOG) planarizing materials and siloxane spin-on-glass (SOG) planarizing materials.

15. The method of claim 1, wherein the plasma etch method includes a trifluoromethane flow rate of from about 5 to 20 sccm.

16. The method of claim 8, wherein the plasma etch method includes a trifluoromethane flow rate of from about 5 to 20 sccm.

* * * * *